US006049460A

United States Patent [19]

Lin

[11] Patent Number: 6,049,460

[45] Date of Patent: Apr. 11, 2000

[54] TRIGGER ACTUATED CONTROL HAVING SUPPLEMENTAL HEAT SINK

[75] Inventor: Yu Min Lin, Milwaukee, Wis.

[73] Assignee: Eaton Corporation, Cleveland, Ohio

[21] Appl. No.: 09/378,136

[22] Filed: Jul. 19, 1999

[51] Int. Cl.[7] .......... H05K 7/20

[52] U.S. Cl. .......... 361/709; 361/704; 200/157

[58] Field of Search .......... 361/702–704, 361/707–711; 310/47, 50, 64, 67 R; 318/301, 305, 345 C, 345 G, 345 H, 345 D; 430/17 R, 17 B, 17 C; 200/5 R, 43.17, 155 R, 157, 239–243, 267, 287, 292, 321, 328, 307, 140–141, 139; 29/846, 852, 829, 860, 589, 585, 622

[56] References Cited

U.S. PATENT DOCUMENTS

| | | | |
|---|---|---|---|
| 3,648,142 | 3/1972 | Corey et al. | 318/345 |
| 3,775,576 | 11/1973 | Brown | 200/157 |
| 4,100,383 | 7/1978 | Piber | 200/157 |
| 4,137,490 | 1/1979 | Brozoski et al. | 318/345 |
| 4,205,434 | 6/1980 | Brozoski et al. | 29/860 |
| 4,506,198 | 3/1985 | Savas | 318/301 |
| 4,737,661 | 4/1988 | Lessig, III et al. | 307/140 |
| 4,937,705 | 6/1990 | Piber | 361/388 |
| 5,200,657 | 4/1993 | Prestel | 310/50 |
| 5,574,626 | 11/1996 | Smith | 361/704 |
| 5,875,096 | 2/1999 | Gates | 361/704 |

*Primary Examiner*—Gerald Tolin
*Assistant Examiner*—Michael Datskovsky
*Attorney, Agent, or Firm*—Larry G. Vande Zande

[57] ABSTRACT

A heat sink is slideably attached to a housing of an electronic control, retained by complemental snap-in elements and has a projection extending through a wall of the housing into abutting thermal engagement with an internal heat sink which is in intimate contact with the electronics of the control.

10 Claims, 3 Drawing Sheets

TRIGGER ACTUATED CONTROL HAVING SUPPLEMENTAL HEAT SINK

CROSS-REFERENCE TO RELATED APPLICATIONS

Not Applicable

STATEMENT REGARDING FEDERALLY SPONSORED RESEARCH OR DEVELOPMENT

Not Applicable

MICROFICHE APPENDIX

Not Applicable

BACKGROUND OF THE INVENTION

This invention relates to trigger actuated controls for portable electric tools wherein the rotational speed of the motor is controlled as a function of displacement of a trigger actuator. The trigger operator is connected to a movable actuator element of a variable resistor which is connected in circuit with a thyristor, the electric motor of the tool, and a source of electric power. A significant amount of heat is generated by electronic components of such speed control circuits, particularly by the thyristor which switches the electric power. Heat sinks are commonly provided in the control for dissipating the heat. As the electrical ratings of the tools increase, the power increases as does the quantity of heat to be dissipated. It is known to extend an internal heat sink externally of the control housing or to connect the thyristor to an external heat sink or to the case of the tool by a bolted connection or the like. Such practices require modification of the control and/or additional assembly steps to complete the mechanical connection, often performed by the tool manufacturer at the time of assembly of the control to the tool. Either solution generally represents increased cost to the tool manufacturer.

BRIEF SUMMARY OF THE INVENTION

This invention provides a trigger actuated control for controlling the rotational speed of an electric motor of a portable electric tool wherein an external supplemental heat sink may be readily attached to the control. The supplemental heat sink has oppositely directed laterally projecting ribs which are slidably received in complemental grooves on opposite sides of an opening through a wall of the control housing. A projection of the heat sink extends into the control housing to abuttingly engage a primary heat sink contained within the housing. The primary heat sink is contained on a base assembly which is insertable from an open side of the housing in the same direction as is the supplemental heat sink. The supplemental heat sink is positioned in engagement with the primary heat sink while the base assembly is separated from the housing, and the two elements are inserted simultaneously to the control housing. Cooperating structural formations on the supplemental heat sink, the base assembly and the control housing create an interlocking structure which retains the supplemental heat sink attached to the control. Complemental abutting faces of the two heat sinks are formed at an angle to provide a wedging effect for enhanced thermal transfer engagement.

DETAILED DESCRIPTION OF THE INVENTION

Figure 1:
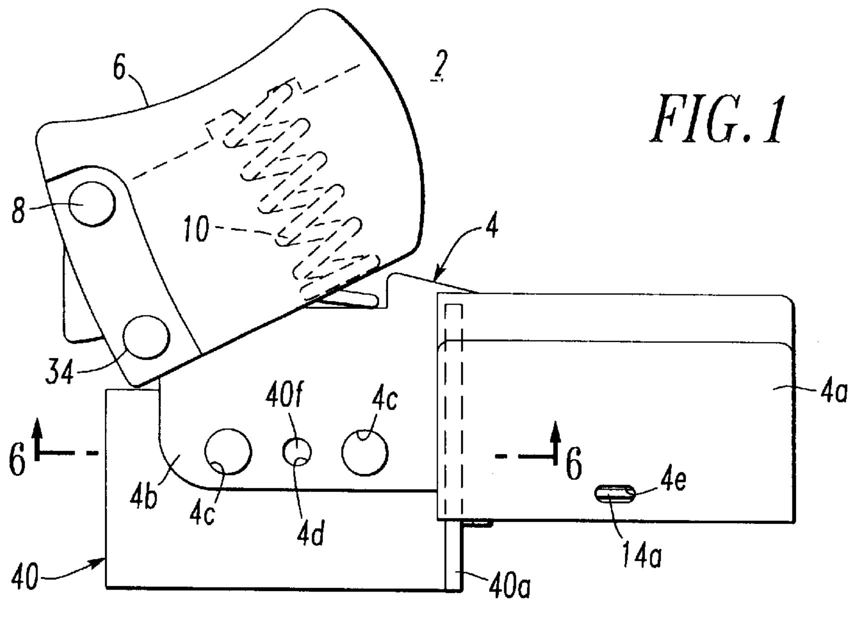
FIG. 1 is a side elevation view of a trigger actuated control and supplemental heat sink constructed in accordance with this invention.

A trigger actuated control for controlling the rotational speed of an electric motor is shown in side elevation in FIG. 1. Control 2 is an overhanging trigger styled control comprising a molded insulating frame 4 having a generally rectangular housing 4*a* open to the bottom surface as oriented in FIG. 1 and a trigger supporting extension 4*b* at the left-hand end. A trigger operator 6 is pivotally supported at the distal end of the extension 4*b* by a rivet 8 which passes through the trigger 6 and the extension 4*b*. Trigger 6 is generally U-shaped in cross section and straddles the extension 4*b*. Trigger 6 is biased counter-clockwise about the rivet 8 by a helical compression spring 10 disposed between extension 4*b* and a bight portion of trigger 6. Trigger support extension 4*b* is provided with a pair of holes 4*c* for mounting the control in a portable electric tool and a smaller third hole 4*d* for retaking a supplemental heat sink of this invention assembled to the frame 4 as will be described more fully hereinafter.

Housing portion 4*a* of frame 4 is open to the bottom for receiving a base assembly of the control. The base assembly comprises two base halves 12 and 14 (FIGS. 2–4) which are positioned together side-by-side creating a sandwich style receptacle therebetween for a printed circuit board 16, heat sink 18 and resistor strip 20 of the speed control circuit. The outside surfaces of the respective base halves 12 and 14 are provided with electric switch components such as stationary contacts 22, 24, movable electrical contacts 26, jumper contact 28 and wiring terminal connectors 30. The base halves with circuit and switch components assembled thereto are positioned together and inserted into the open bottom end of housing portion 4*a* of frame 4 and are retained therein by bosses 12*a* and 14*a* on the outer surfaces of the respective base half moldings which snap into holes 4*e* at the lower edges of opposite side walls of housing portion 4*a*. A more complete description of the details of this construction can be found in H. W. Brown U.S. Pat. No. 3,775,576 issued Nov. 27, 1973 and assigned to the assignee of this invention.

Figure 2:
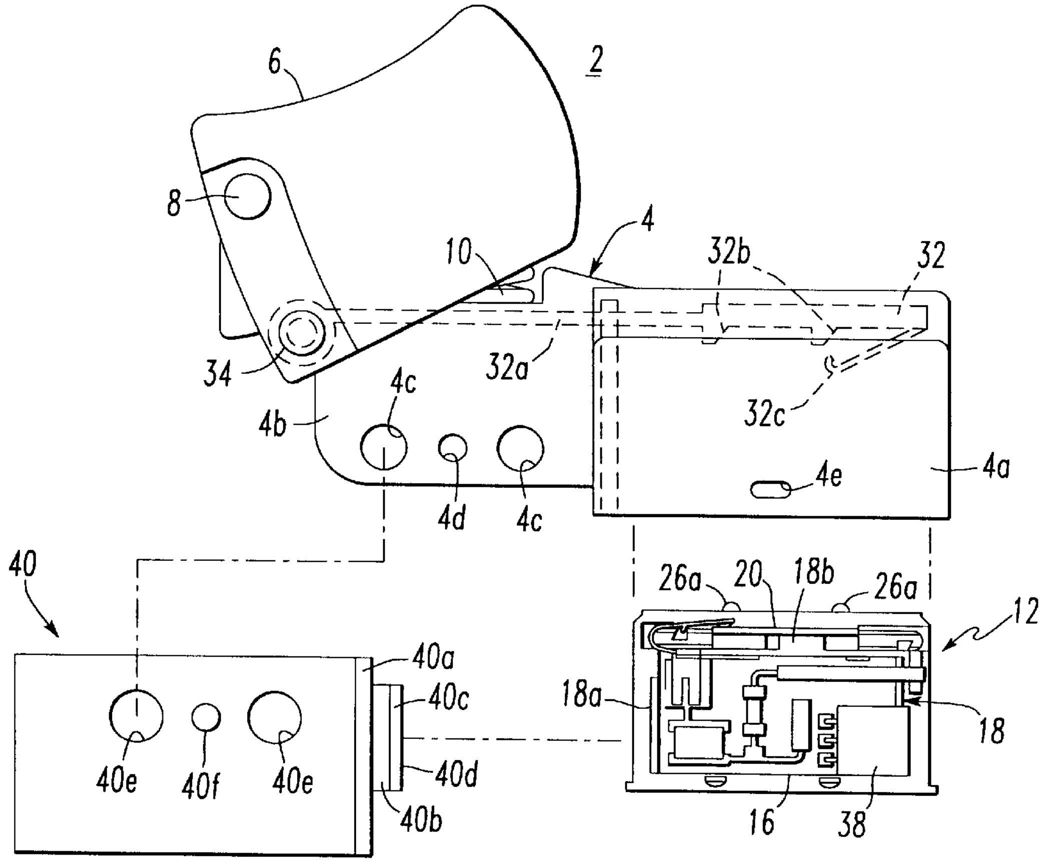
FIG. 2 is an exploded view similar to FIG. 1 showing a base assembly (with a forward base half removed) and the supplemental heat sink disassembled from the control housing.

The frame 4 and trigger 6 assembly further comprise an actuator 32, shown in dotted lines in FIG. 2, within the housing 4*a* which has an elongated rod 32*a* extending through a slot 4*f* in left-hand end wall of housing 4*a* to trigger operator 6 where it is pivotally connected to the trigger 6 by a rivet 34. Slider 32 has cam surfaces 32*b* molded thereon on opposite sides to engage upstanding tabs 26*a* of movable contacts 26 to depress the appropriate end(s) of the movable contact according to the position of the slider

32. Slider 32 also carries a movable wiper 32*c,* made from conductive spring material, which engages resistor strip 20 in final assembly of the control. Clockwise depression of the trigger 6 about rivet 8 against the bias of return spring 10 causes rivet 34 to move leftwardly, pulling the carrier 32 leftwardly within the housing 4*a* by virtue of the connecting rod 32*a*. In the "at-rest" position of slider 32 against the right-hand end wall of housing 4*a,* cams 32*b* engage the tabs 26*a* to hold movable contact 26 depressed, out of contact with stationary contacts 22, 24. Leftward movement of slider 32 moves the cam surfaces 32*b* from engagement with the movable contact tabs 26*a* causing the movable contact to move to the position shown in FIG. 3 wherein the left and right hand ends abut the stationary contacts 22 and 24 respectively, thereby closing the circuit between those stationary contacts. A serpentine spring 36 is disposed within the base half 12 to bear against the underside of movable contact 26, biasing it to the closed position with movable contacts 22 and 24. Although not shown, electric wire leads are insertable into the base halves through appropriate openings 12*b* and 14*b* in the respective molded base half to be wedged in electrical engagement against the surface of stationary contacts 22, 24, or 28, thereby permitting the control to be electrically connected to the power supply and to the electric tool motor.

Figure 3:
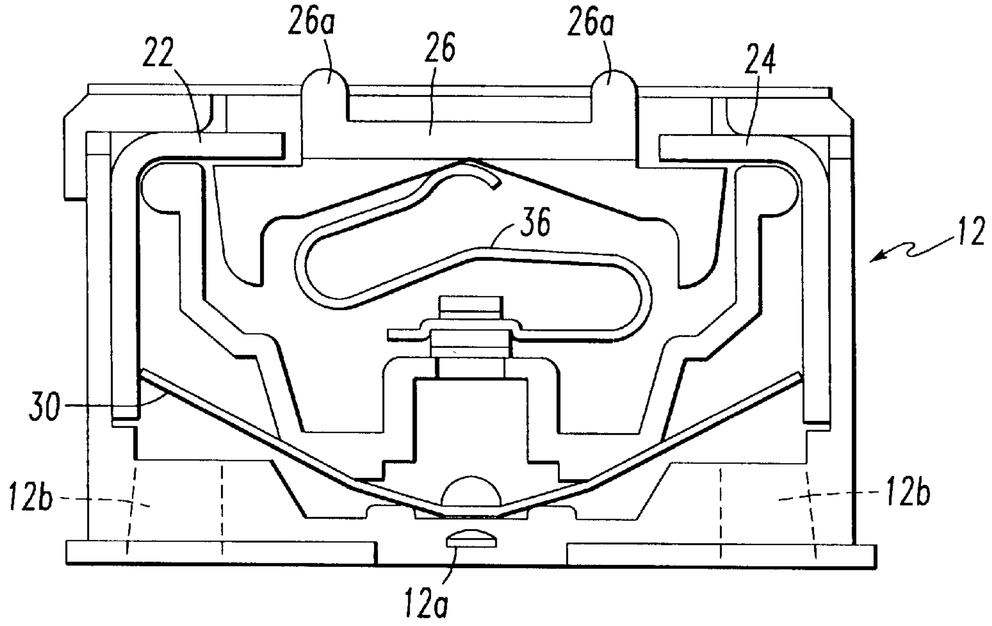
FIG. 3 is an elevational view of a switch assembly of the control which is assembled on the back side of the base assembly shown in FIG. 2.
Figure 4:
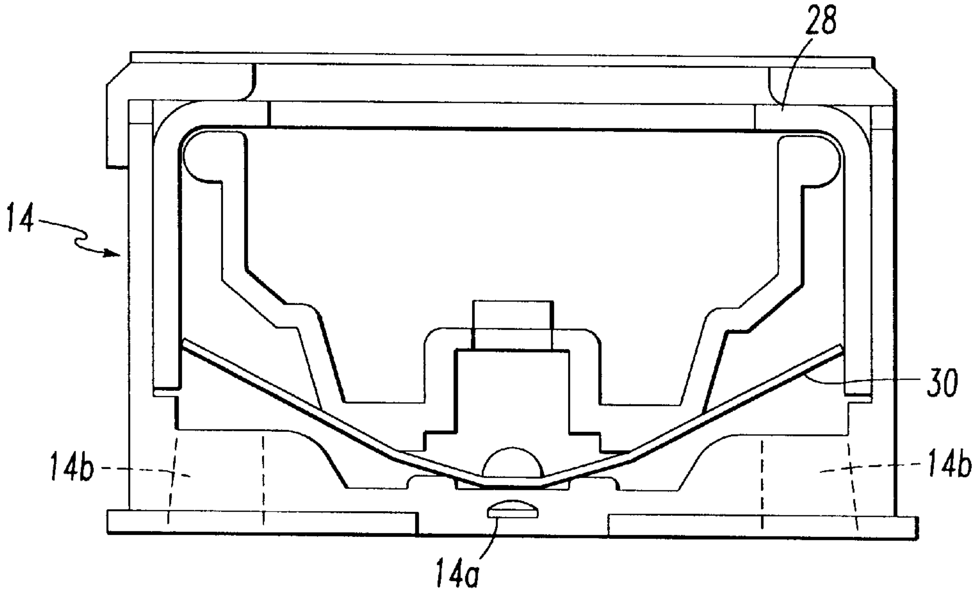
FIG. 4 is an elevational view of a forward base half of the base assembly which is removed from the base assembly shown in FIG. 2.
Figure 5:
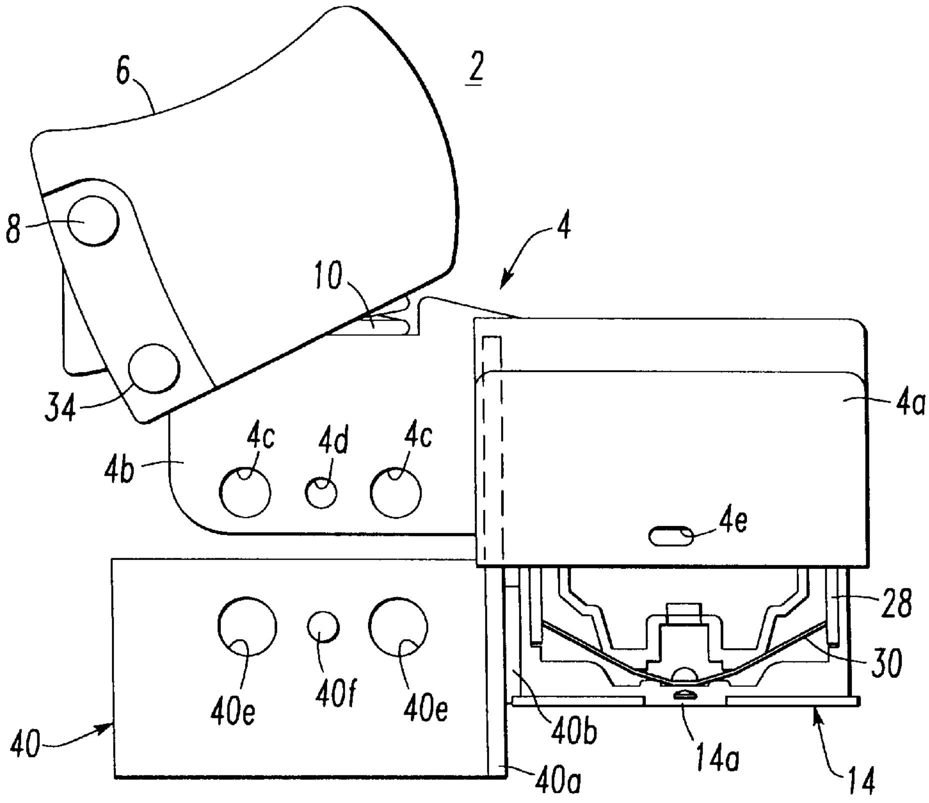
FIG. 5 is a view similar to FIG. 2 showing the supplemental heat sink assembled to the base assembly and partially inserted into the control housing.

Each base half of the trigger actuated control of this invention may comprise a movable contact switch such as shown in FIG. 3 whereupon a double break switch construction is provided. However, one switch pole may be eliminated in certain applications in favor of a common connector strap such as 28 as shown in FIG. 4. Thus the movable contact 26 and biasing spring 36 are not present in the base half 14.

The integrated circuit 16 comprises a thyristor 38 such as an SCR or a Triac or the like. The substrate of the integrated circuit 16 is thermally bonded to the heat sink 18 which is substantially coextensive with the integrated circuit substrate except for a tab 18*a* which extends forwardly around the left-hand end of substrate 16 and an upstanding portion 18*b* which lies adjacent the resistor strip 20. With the control 2 suitably electrically wired to the electric tool motor and power source, the control is electrically connected in circuit with the motor and power source upon initial movement of trigger 6 to cause movable contact 26 to close on stationary contacts 22 and 24. The rotational speed of the tool is controlled by the amount of depression of the trigger operator 6 which causes the slider 32*c* to move along the resistor strip 20, thereby changing the resistance and the firing angle of the thyristor 38 in a well known manner. Conduction of thyristor 38 generates heat which must be dissipated by heat sink 18. Demands for greater power in electric tools result in higher rated thyristors and generation of more heat. Heat sink 18 may not be adequate to completely dissipate the heat generated by the control.

Figure 6:
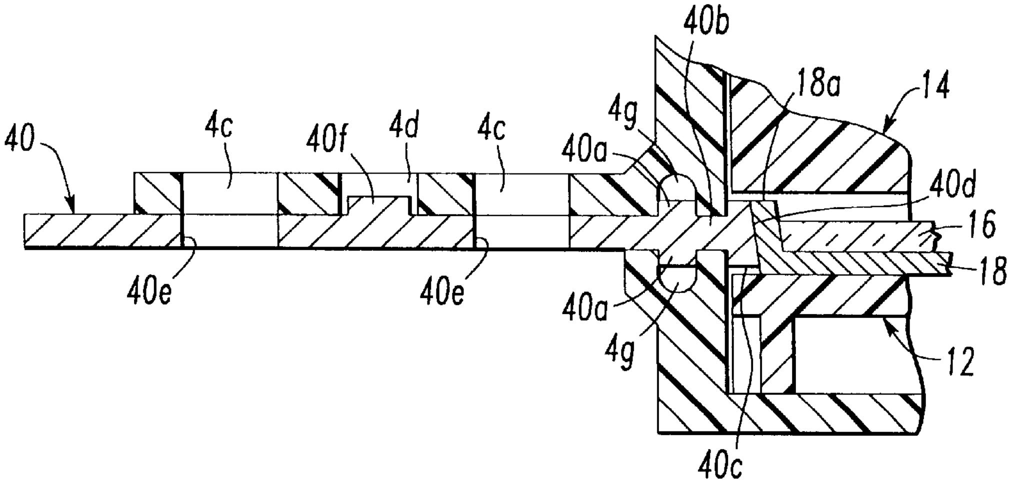
FIG. 6 is a partial cross-sectional view taken along the lines 6—6 of FIG. 1 showing the supplemental heat sink attached to the control housing and in thermal contact with the primary heat sink.

This invention provides a supplemental heat sink 40 which may be readily attached to the frame 4 and connected to the heat sink 18 during assembly of the base halves 12 and 14 to the frame 4. As seen particularly in FIGS. 2 and 6, the heat sink 40 comprises a rectangular plate of good thermally conductive material such as aluminum which has a pair of oppositely directed vertically extending ribs 40*a* at the right hand end. A projection 40*b* extends beyond the ribs 40*a* and has a widened end portion 40*c*. The outermost surface 40*d* of widened end portion 40*c* is disposed at a shallow angle to be complementary to flange 18*a* of the heat sink 18. As earlier described, housing portion 4*a* of frame 4 has a vertically extending slot 4*f* through the left-hand end wall adjacent extension 4*b* for assembling the slider 32 and elongated rod 32*a* into the frame. Vertically extending grooves 4*g* (FIG. 6) are provided on opposite faces of the slot 4*f* in the housing for customarily receiving a sealing or closing member for the housing after assembly of the slider 32. Such member is eliminated herein. The supplemental heat sink 40 is assembled to control 2 by inserting projection 40*c* between the assembled base halves 12 and 14 such that the angled surface 40*d* abuts the surface of flange 18*a* of heat sink 18. The base halves and supplemental heat sink are thereafter inserted into the frame from the open end wherein the ribs 40*a* are slideably disposed within the grooves 4*g*. Extension 40*c* is appropriately dimensional to provide a tight interference fit with the flange 18*a* of heat sink 18 to maintain good thermal engagement therewith. The supplemental heat sink 40 is also provided with a pair of holes 40*e* which are in corresponding alignment with the holes 4*c* of the projection 4*b* for mounting the control 2 to the tool. A boss 40*f* is disposed between the holes 40*e* and is received in the hole 4*d* when the assembly is fully inserted into the frame to provide a further retention for heat sink 40 with the frame 4.

The foregoing describes a structure for readily and effectively increasing heat dissipation capabilities of a rotational speed control for a portable electric tool or the like. Although the invention has been described in conjunction with an overhanging trigger control, it is to be understood that it is readily applicable to other controls, including for example in-line trigger speed controls, and further is susceptible to various modifications without departing from the scope of the appended claims.

Although the invention has hereinabove been described with respect to the illustrated embodiments, it will be understood that the invention is capable of modification and variation and is limited only by the following claims.

I claim:

1. A trigger actuated control for controlling rotational speed of an electric motor of a portable tool, said control having:

an electrically insulating housing;

a manually displaceable trigger mounted to said housing;

an electric circuit in said housing comprising a variable resistor operably connected to said trigger and a thyristor connected in circuit with said variable resistance and the electric motor of said portable tool for varying rotational speed of said motor as a function of displacement of said trigger; and a primary heat sink in said housing thermally coupled with at least said thyristor;

wherein the improvement comprises:

an opening in said housing;

a supplemental heat sink disposed externally of said housing and having a projection extending through said opening into thermally coupled relationship with said primary heat sink; and complemental attachment means on said housing and said supplemental heat sink for attaching said supplemental heat sink to said housing.

2. The trigger actuated control defined in claim 1 wherein said projection directly engages said primary heat sink.

3. The trigger actuated control defined in claim 1 wherein a surface on said projection is in abutting engagement with a surface on said primary heat sink.

4. The trigger actuated control defined in claim 1 wherein said projection and said primary heat sink comprise mating surfaces disposed at complementary angles, said surfaces being retained in a wedged abutting engagement by said attachment of said supplemental heat sink to said housing.

5. The trigger actuated control defined in claim 1 wherein said complemental attachment means comprise grooves along opposite sides of said opening, said grooves being open at one side of said housing, and oppositely directed lateral ribs on said supplemental heat sink slideably received in said grooves from said one side of said housing.

6. The trigger actuated control defined in claim 5 wherein said housing and said supplemental heat sink comprise interlocking retention means engaged upon complete insertion of said supplemental heat sink to said housing for blocking withdrawal of said supplemental heat sink from said housing.

7. The trigger actuated control defined in claim 5 wherein said housing is open at said one side and comprises a base assembly containing said primary heat sink slideably inserted from said one side in a direction common with a direction in which said ribs are received in said grooves, said projection and said primary heat sink comprising mating surfaces positioned in abutting relationship with said base assembly and said supplemental heat sink disposed outside said housing, said base assembly and said supplemental heat sink being simultaneously inserted into said housing for attaching said supplemental heat sink to said housing and retaining said mating surfaces in abutting relation.

8. The trigger actuated control defined in claim 7 wherein said base assembly overlaps said projection for blocking removal of said supplemental heat sink with said base assembly inserted in said housing.

9. The trigger actuated control defined in claim 3 wherein said housing comprises an extension and said supplemental heat sink is supported by said extension.

10. The trigger actuated control defined in claim 9 wherein said supplemental heat sink and said extension comprise interlocking retention means engaged upon complete insertion of said supplemental heat sink to said housing for blocking withdrawal of said supplemental heat sink from said housing.

* * * * *